United States Patent
Isobe (10) Patent No.: US 11,201,054 B2
(45) Date of Patent: Dec. 14, 2021

(54) METHOD OF MANUFACTURING SEMICONDUCTOR DEVICE HAVING HIGHER EXHAUST PIPE TEMPERATURE AND NON-TRANSITORY COMPUTER-READABLE RECORDING MEDIUM

(71) Applicant: KOKUSAI ELECTRIC CORPORATION, Tokyo (JP)

(72) Inventor: Noriyuki Isobe, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/294,471

(22) Filed: Mar. 6, 2019

(65) Prior Publication Data
US 2019/0304771 A1    Oct. 3, 2019

(30) Foreign Application Priority Data
Mar. 27, 2018    (JP) .............................. JP2018-060037

(51) Int. Cl.
| | | |
|---|---|---|
| H01L 21/02 | (2006.01) | |
| C23C 16/455 | (2006.01) | |
| C23C 16/52 | (2006.01) | |
| H01L 21/67 | (2006.01) | |
| H01J 37/32 | (2006.01) | |

(Continued)

(52) U.S. Cl.
CPC ........ *H01L 21/0228* (2013.01); *C23C 16/405* (2013.01); *C23C 16/4408* (2013.01);
(Continued)

(58) Field of Classification Search
None
See application file for complete search history.

(56) References Cited

U.S. PATENT DOCUMENTS

| | | | | |
|---|---|---|---|---|
| 5,753,891 A | * | 5/1998 | Iwata | ................ H01L 21/67109 |
| | | | | 219/390 |
| 2004/0002220 A1 | * | 1/2004 | Mizushima | ......... C23C 16/4405 |
| | | | | 438/706 |

(Continued)

FOREIGN PATENT DOCUMENTS

| | | |
|---|---|---|
| JP | 2002-222805 A | 8/2002 |
| JP | 2004-221171 A | 8/2004 |

(Continued)

OTHER PUBLICATIONS

Korean Office Action dated Mar. 13, 2020 for the Korean Patent Application No. 10-2019-0022246.

(Continued)

*Primary Examiner* — Eduardo A Rodela
*Assistant Examiner* — Christopher M Roland
(74) *Attorney, Agent, or Firm* — Volpe Koenig (57) ABSTRACT

According to one aspect of the technique described herein, there is provided a technique including: forming a film on a substrate by performing a cycle a predetermined number of times, wherein the cycle includes sequentially performing: (a) supplying source gas to a substrate accommodated in a reaction tube; (b) exhausting the source gas remaining in the reaction tube through an exhaust pipe connected to the reaction tube; (c) supplying a reactive gas reacting with the source gas to the substrate; and (d) exhausting the reactive gas remaining in the reaction tube through the exhaust pipe, wherein at least in (a) and (c), a temperature of the reaction tube is set to a first temperature lower than a thermal decomposition temperature of the source gas and higher than a condensation temperature of the source gas and a temperature of the exhaust pipe is set to a second temperature equal to or higher than the first temperature.

12 Claims, 6 Drawing Sheets

(51) Int. Cl.
*C23C 16/44* (2006.01)
*C23C 16/458* (2006.01)
*C23C 16/40* (2006.01)
*H01L 21/285* (2006.01)
*H01L 21/324* (2006.01)

(52) U.S. Cl.
CPC ........ *C23C 16/4412* (2013.01); *C23C 16/455* (2013.01); *C23C 16/4584* (2013.01); *C23C 16/45527* (2013.01); *C23C 16/45546* (2013.01); *C23C 16/45578* (2013.01); *C23C 16/52* (2013.01); *H01J 37/3244* (2013.01); *H01L 21/02186* (2013.01); *H01L 21/02697* (2013.01); *H01L 21/28556* (2013.01); *H01L 21/324* (2013.01); *H01L 21/67017* (2013.01); *H01L 21/67098* (2013.01); *H01L 21/67109* (2013.01); *H01L 21/67248* (2013.01)

(56) References Cited

U.S. PATENT DOCUMENTS

| | | | |
|---|---|---|---|
| 2007/0093078 A1* | 4/2007 | Harada | C23C 16/401 438/790 |
| 2010/0279008 A1 | 11/2010 | Takagi | |
| 2015/0136027 A1* | 5/2015 | Hara | H01J 37/32834 118/725 |
| 2015/0376781 A1* | 12/2015 | Kogura | H01L 21/02126 438/758 |
| 2016/0060755 A1* | 3/2016 | Kamakura | C23C 16/46 156/345.29 |
| 2017/0198391 A1* | 7/2017 | Ashihara | C23C 16/345 |
| 2017/0204860 A1* | 7/2017 | Nishimura | H01L 21/3065 |
| 2018/0204720 A1* | 7/2018 | Tanaka | H01L 21/02164 |

FOREIGN PATENT DOCUMENTS

| | | |
|---|---|---|
| JP | 2010-280945 A | 12/2010 |
| JP | 6023854 B1 | 11/2016 |
| KR | 10-2010-0051597 A | 5/2010 |

OTHER PUBLICATIONS

Japanese Office Action dated Feb. 25, 2020 for the Japanese Patent Application No. 2018-060037.

* cited by examiner

METHOD OF MANUFACTURING SEMICONDUCTOR DEVICE HAVING HIGHER EXHAUST PIPE TEMPERATURE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2018-060037, filed on Mar. 27, 2018, in the Japanese Patent Office, the entire contents of which are hereby incorporated by reference.

BACKGROUND

1. Field

The present disclosure relates to a method of manufacturing a semiconductor device, a substrate processing apparatus and a non-transitory computer-readable recording medium.

2. Description of the Related Art

As one of manufacturing processes of a semiconductor device, a film-forming process for forming a film on a substrate accommodated in a process chamber may be performed. For example, a conductive film such as a titanium oxide film (TiO film) may be formed on the substrate using the film-forming process.

When forming the conductive film as described above, a vaporized gas generated by vaporizing a liquid source may be used. However, when the vaporized gas is supplied into the process chamber and exhausted through an exhaust pipe, the vaporized gas may be thermally decomposed in the exhaust pipe and by-products may be deposited in the exhaust pipe, or the vaporized gas may be re-liquefied in the exhaust pipe. As a result, the exhaust pipe may be clogged and the vaporized gas may be stagnant in the exhaust pipe.

SUMMARY

Described herein is a technique capable of suppressing a thermal decomposition and a re-liquefaction of a vaporized gas in an exhaust pipe when a liquid source is vaporized and used as the vaporized gas to form a film on a substrate.

According to one aspect of the technique described herein, there is provided a technique including: forming a film on a substrate by performing a cycle a predetermined number of times, wherein the cycle includes sequentially performing: (a) supplying a source gas to a substrate accommodated in a reaction tube; (b) exhausting the source gas remaining in the reaction tube through an exhaust pipe connected to the reaction tube; (c) supplying a reactive gas reacting with the source gas to the substrate; and (d) exhausting the reactive gas remaining in the reaction tube through the exhaust pipe, wherein at least in (a) and (c), a temperature of the reaction tube is set to a first temperature lower than a thermal decomposition temperature of the source gas and higher than a condensation temperature of the source gas and a temperature of the exhaust pipe is set to a second temperature equal to or higher than the first temperature.

DETAILED DESCRIPTION

In recent years, it has been required to lower the temperature of a film-forming process. However, when a vaporized gas (hereinafter, also referred to as a "source gas") generated by vaporizing a liquid source is supplied into a process chamber exhausted through an exhaust pipe, the vaporized gas may be thermally decomposed in the exhaust pipe and by-products may be deposited in the exhaust pipe, or the vaporized gas may be re-liquefied in the exhaust pipe. As a result, the exhaust pipe may be clogged and the vaporized gas may be stagnant in the exhaust pipe. The inventor of the present application has discovered that the exhaust pipe may be clogged and the vaporized gas may be stagnant in the exhaust pipe for the following reasons.

When the film-forming process is performed, in general, a temperature of the exhaust pipe is significantly higher than that of the process chamber. For example, the temperature of the exhaust pipe is 1.8 to 3 times as high as the temperature of the process chamber in centigrade. However, when the vaporized gas is obtained by vaporizing the liquid source such as an organic material based source (organic compound) having a particularly low self decomposition temperature, the vaporized gas may be thermally decomposed even at a low temperature to generate by-products. The by-product may be thermally decomposed due to the remarkably high temperature of the exhaust pipe, and be powderized. The by-products generated by thermal decomposition of the vaporized gas adhere to the exhaust pipe as a film up to a certain temperature. However, when the temperature of the by-products exceeds the certain temperature, the by-products are powderized and adhere to the exhaust pipe as powder. If the by-products adhere to the exhaust pipe as powder, thermal convection tends to occur more than the case where the by-products adhere to the exhaust pipe as a film. Particularly, the liquid source having a low vapor pressure is easily re-liquefied as its temperature decreases. In addition, since the volume of the exhaust pipe is smaller than that of the process chamber, the density of the by-products or the density of the ligands desorbed from the vaporized gas are thought to be higher in the exhaust pipe than that of the by-products or the ligands in the process chamber. That is, the pressure of the by-products or the ligands in the exhaust pipe is higher than that of the by-products or the ligands in the process chamber. Therefore, the vaporized gas is liable to be re-liquefied in the exhaust pipe more than the process chamber. The re-liquefied liquid source tends to be stagnant in the components such as the exhaust pipe and an APC valve which will be described later.

In view of the above, the inventor of the present application conceived the following technique. When setting the temperature of the process chamber to a temperature lower than a thermal decomposition temperature of the vaporized gas and higher than a condensation temperature of the vaporized gas in order to suppress the deposition of the by-products and the stagnation of the vaporized gas in the exhaust pipe while maintaining a low temperature of the film-forming process, the temperature of the exhaust pipe is set to a temperature equal to or slightly higher than the temperature of the process chamber, for example, equal to or higher than the temperature of the process chamber and equal to or lower than 1.6 times the temperature of the process chamber in centigrade. By setting the temperature of the exhaust pipe to the above-described temperature, it is possible to suppress the thermal decomposition of the vaporized gas. According to this technique, even if the vaporized gas is thermally decomposed in the exhaust pipe, the by-products are not powderized but adhere to the exhaust pipe as a film. In addition, since the temperature of the exhaust pipe is higher than the condensation temperature, it is possible to suppress the re-liquefaction of the vaporized gas in the exhaust pipe. This technique will be described below in detail.

EMBODIMENT

Hereinafter, an embodiment according to the technique will be described with reference to FIGS. 1 through 4. A substrate processing apparatus 10 is an example of an apparatus used in manufacturing processes of a semiconductor device.

(1) Configuration of Substrate Processing Apparatus

Figure 1:
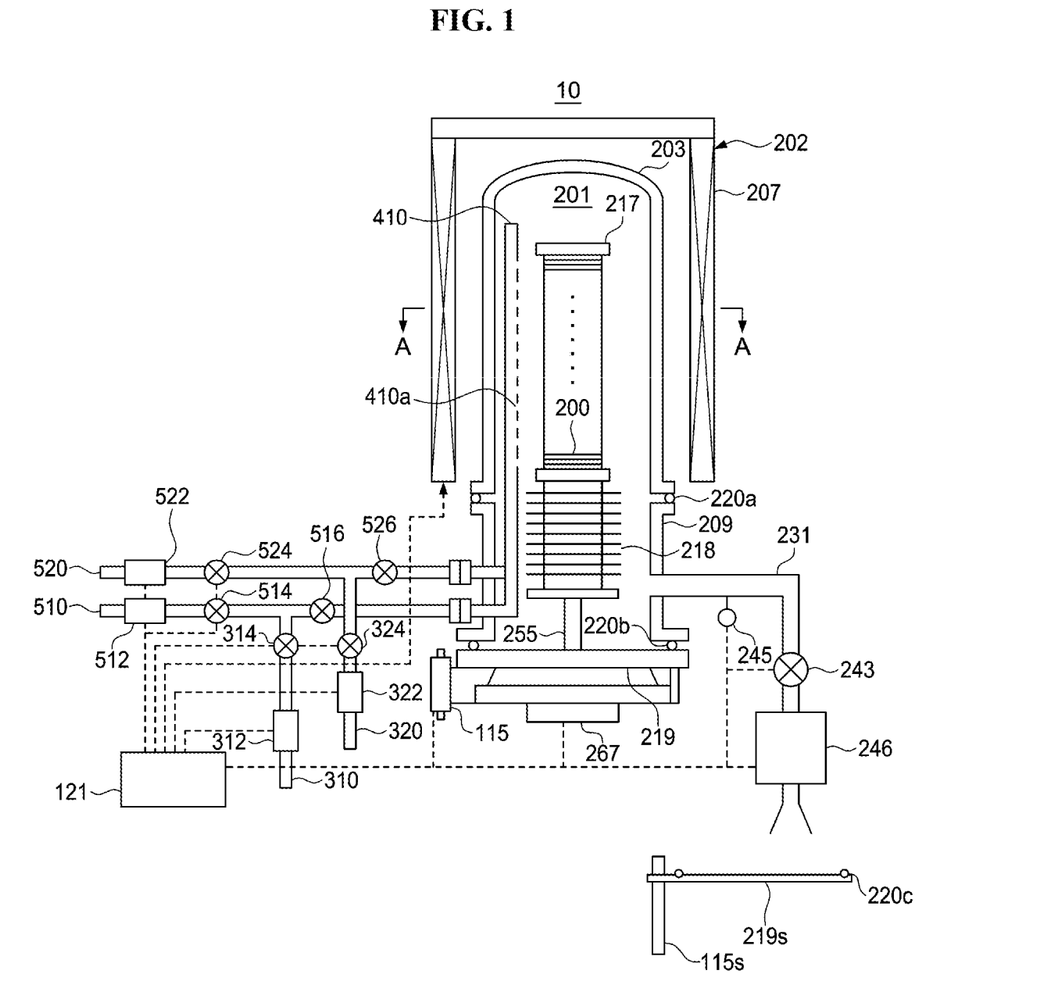
FIG. 1 schematically illustrates a vertical cross-section of a processing furnace of a substrate processing apparatus preferably used in an embodiment described herein.

The substrate processing apparatus 10 includes a processing furnace 202. The processing furnace 202 is provided with a heater 207 serving as a heating apparatus (heating mechanism, heating system). The heater 207 is cylindrical, and vertically installed while being supported by a heater base (not shown) serving as a support plate.

A reaction tube 203 is provided in the heater 207 so as to be concentric with the heater 207. The reaction tube 203 is made of a heat-resistant material such as quartz ($SiO_2$) and silicon carbide (SiC), and cylindrical with a closed upper end and an open lower end. A manifold 209 is provided under the reaction tube 203 so as to be concentric with the reaction tube 203. The manifold 209 is made of a metal such as stainless steel (SUS), and cylindrical with open upper and lower ends. An O-ring 220a serving as a sealing member is provided between an upper end of the manifold 209 and the reaction tube 203. As the manifold 209 is supported by the heater base, the reaction tube 203 is installed to be perpendicular to the heater 207. A process vessel (reaction vessel) is mainly constituted by the reaction tube 203 and the manifold 209. A process chamber 201 is provided in a hollow cylindrical portion of the process vessel. The process chamber 201 is configured to accommodate vertically arranged wafers 200 serving as substrates in a horizontal orientation in a multistage manner by a boat 217 to be described later.

Figure 3:
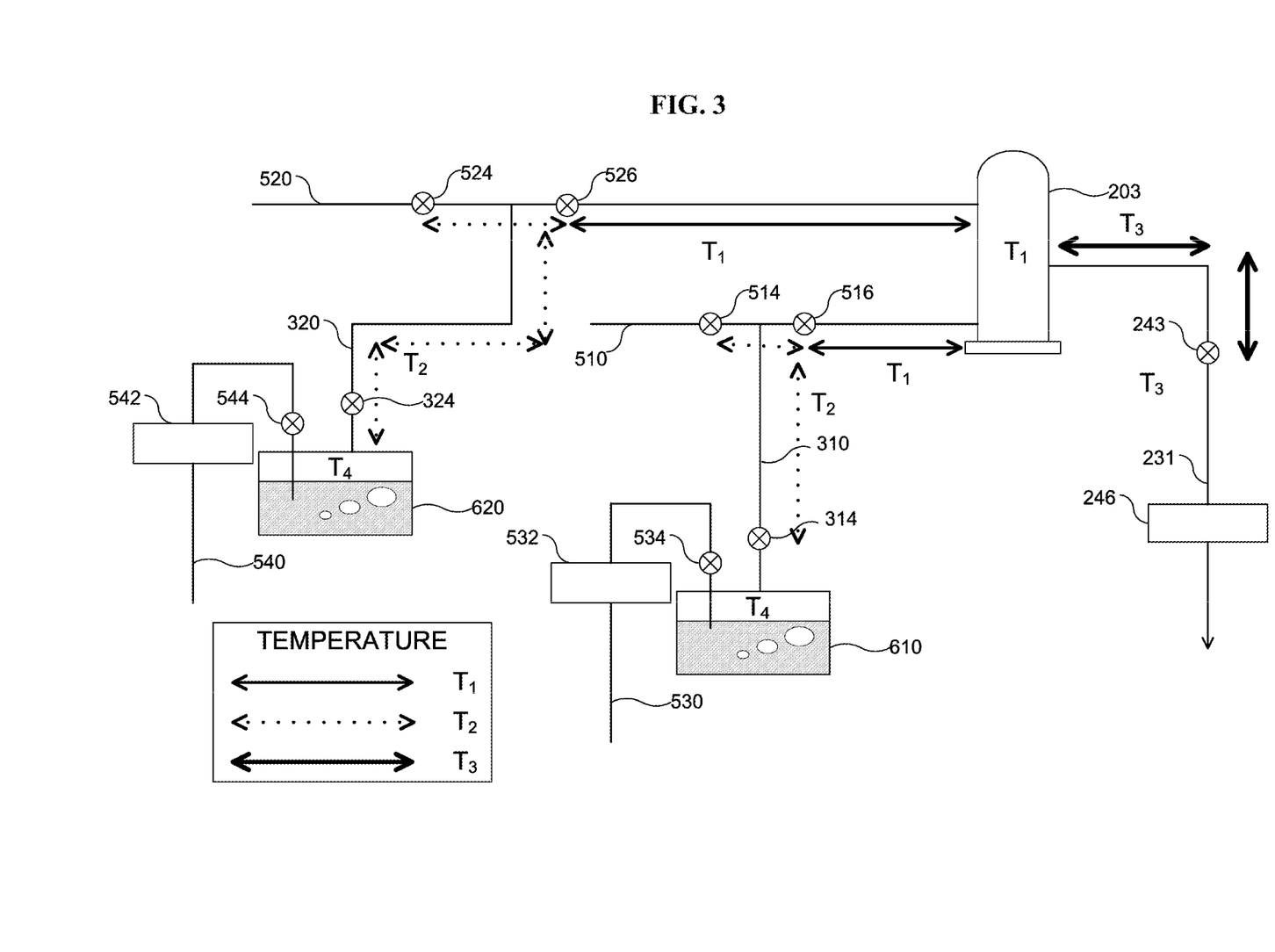
FIG. 3 schematically illustrates a pipe system of the substrate processing apparatus shown in FIG. 1.

Nozzles 410 and 420 are provided in the process chamber 201 through sidewalls of the manifold 209. Gas supply pipes 310 and 320 are connected to the nozzles 410 and 420, respectively. Gas supply pipes 310 and 320 serve as gas supply lines. The gas supply lines may further include the nozzles 410 and 420. The processing furnace 202 of the embodiment is not limited to the above-described example. For example, the number of nozzles may be changed appropriately as necessary.

Tanks (containers) 610 and 620 and valves 314 and 324 serving as opening/closing valves are sequentially provided at the gas supply pipes 310 and 320 from the upstream sides toward the downstream sides of the gas supply pipes 310 and 320, respectively. Gas supply pipes 510 and 520 are connected to the downstream sides of the valves 314 and 324 provided at the gas supply pipes 310 and 320, respectively. Gas supply pipes 510 and 520 serve as gas supply lines for supplying an inert gas. Mass flow controllers (MFCs) 512 and 522 and valves 514, 516, 524 and 526 are sequentially provided at the gas supply pipes 510 and 520 from the upstream sides toward the downstream sides of the gas supply pipes 510 and 520, respectively. Gas supply pipes 530 and 540 serving as gas supply lines for supplying the inert gas are connected to the tanks 610 and 620, respectively. MFCs 532 and 542 and valves 534 and 544 are sequentially provided in the gas supply pipes 530 and 540 from the upstream sides toward the downstream sides of the gas supply pipes 530 and 540, respectively.

Figure 2:
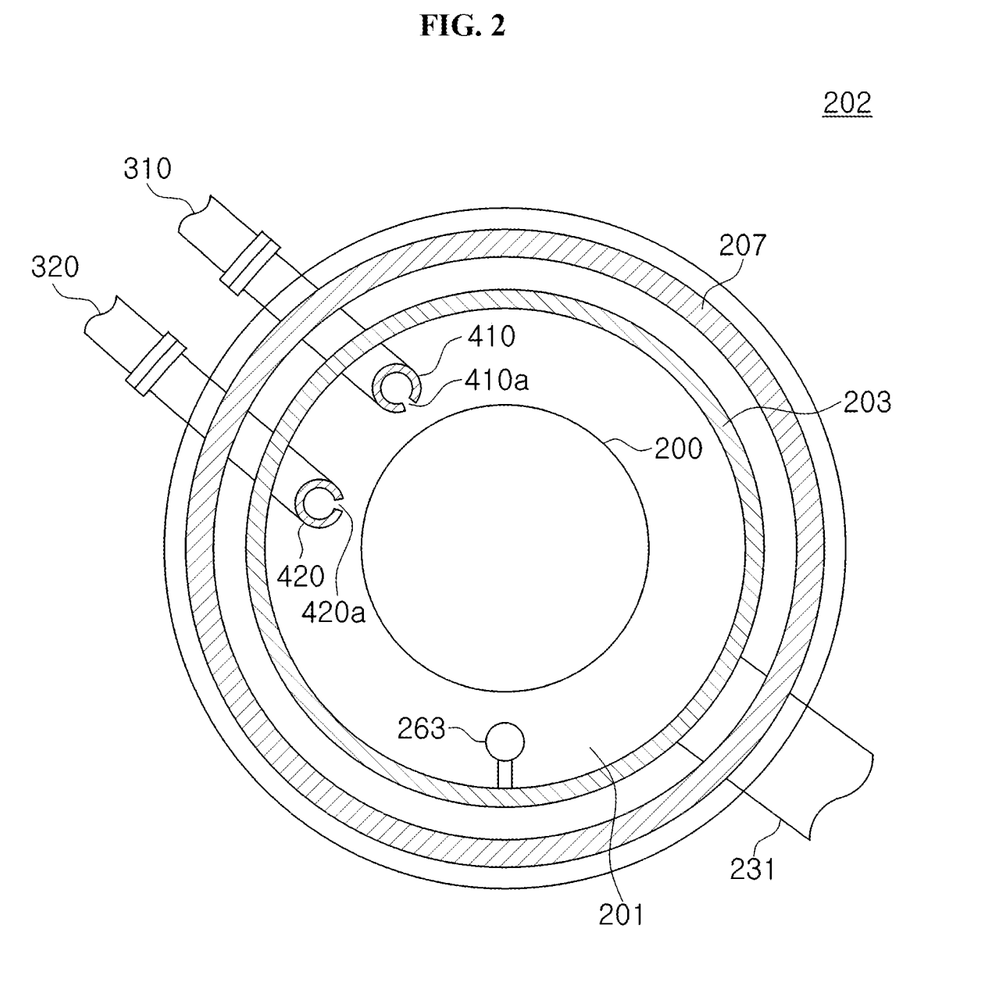
FIG. 2 schematically illustrates a cross-section taken along the line A-A of the processing furnace of the substrate processing apparatus shown in FIG. 1.

The nozzles 410 and 420 may include L-shaped nozzles. Horizontal portions of the nozzles 410 and 420 are installed through the sidewall of the manifold 209 and the reaction tube 203. Vertical portions of the nozzles 410 and 420 are provided in an annular space between the reaction tube 203 and the wafers 200, and extend from a lower portion to an upper portion of the reaction tube 203 along a stacking direction of the wafers 200.

A plurality of gas supply holes 410a and a plurality of gas supply holes 420a for supplying gases are provided at side surfaces of the nozzles 410 and 420, respectively. The plurality of gas supply holes 410a and the plurality of gas supply holes 420a are provided to face the wafers 200 loaded in a wafer loading region, respectively. The plurality of gas supply holes 410a and the plurality of gas supply holes 420a are open toward the center of the reaction tube 203, and configured to supply gases toward the wafers 200. The plurality of gas supply holes 410a and the plurality of gas supply holes 420a are provided from the lower portion of the reaction tube 203 to the upper portion thereof. The plurality of gas supply holes 410a has the same area and pitch and the plurality of gas supply holes 420a has the same area and pitch. However, the plurality of gas supply holes 410a and the plurality of gas supply holes 420a are not limited thereto. The opening areas of the plurality of gas supply holes 410a and the plurality of gas supply holes 420a may gradually increase from lower portions (upstream sides) toward upper portions (downstream sides) of the nozzles 410 and 420, respectively, to maintain the uniformity of the amounts of gases supplied through the plurality of gas supply holes 410a and the plurality of gas supply holes 420a, respectively.

A source gas, which is one of process gases and supplied through the gas supply pipe 310, is supplied into the process chamber 201 via the valves 314 and 516 and the nozzle 410. For example, a metal source containing titanium (Ti) as a metal element and carbon (C), that is, a titanium (Ti) source gas, may be used as the source gas. For example, an organic material based source (organic metal compound, organic material based titanium source) such as TDMAT (tetrakis dimethyl amino titanium, $Ti(NMe_2)_4$) serving as the titanium source gas may be supplied into the process chamber 201 via the valves 314 and 516 and the nozzle 410. The TDMAT is stored in the tank 610 in a liquid state. By supplying the inert gas into the tank 610 through the gas supply pipe 530 provided with the MFC 532 and the valve 534, the organic source such as the TDMAT thereby is vaporized. Then, the vaporized TDMAT gas serving as the source gas is supplied into the gas supply pipe 310. In the present specification, the term "TDMAT" may refer to only "TDMAT in liquid state", only "TDMAT in gaseous state" and both of "TDMAT in liquid state" and "TDMAT in gaseous state".

A reactive gas, which is one of the process gases and supplied through the gas supply pipe 320, is supplied into the process chamber 201 via the valves 324 and 526 and the nozzle 420. For example, an oxygen (O)-containing gas such as water vapor ($H_2O$) may be used as the reactive gas. The $H_2O$ is stored in the tank 620 in a liquid state. By supplying the inert gas into the tank 620 through gas supply pipe 540 provided with the MFC 542 and the valve 544, the $H_2O$ thereby is vaporized. Then, the vaporized $H_2O$ gas serving as the reactive gas is supplied into the gas supply pipe 320. In the present specification, the term "$H_2O$" may refer to only "$H_2O$ in liquid state", only "$H_2O$ in gaseous state" and both of "$H_2O$ in liquid state" and "$H_2O$ in gaseous state".

For example, the inert gas such as nitrogen ($N_2$) gas which is supplied through the gas supply pipes 510 and 520 is supplied into the process chamber 201 via the MFCs 512 and 522, the valves 514, 516, 524 and 526, the gas supply pipes 310 and 320 and the nozzles 410 and 420, respectively.

A source gas supply system is constituted mainly by the gas supply pipe 310, the MFC 312 and the valve 314. The source gas supply system may further include the nozzle 410. The source gas supply system may further include the tank 610, the gas supply pipe 530, the MFC 532 and the valve 534. A reactive gas supply system is constituted mainly by the gas supply pipe 320, the MFC 322 and the valve 324. The reactive gas supply system may further include the nozzle 420. The reactive gas supply system may further include the tank 620, the gas supply pipe 540, the MFC 542 and the valve 544. An inert gas supply system is constituted mainly by the gas supply pipes 510 and 520, the MFCs 512 and 522 and the valves 514, 516, 524 and 526. The source gas supply system and the reactive gas supply system may be collectively referred to as a gas supply system. The gas supply system may further include the inert gas supply system.

An exhaust pipe 231 serving as an exhaust flow path for exhausting an inner atmosphere of the process chamber 201 is provided at the reaction tube 203. A vacuum pump 246 serving as a vacuum exhauster is connected to the exhaust pipe 231 through a pressure sensor 245 and an APC (Automatic Pressure Controller) valve 243. The pressure sensor 245 acts as a pressure detector (pressure detection mechanism) to detect an inner pressure of the process chamber 201, and the APC valve 243 serves as an exhaust valve (pressure adjusting mechanism). With the vacuum pump 246 in operation, the APC valve 243 may be opened/closed to vacuum-exhaust the process chamber 201 or stop the vacuum exhaust. With the vacuum pump 246 in operation, an opening degree of the APC valve 243 may be adjusted based on the pressure detected by the pressure sensor 245, in order to control the inner pressure of the process chamber 201. An exhaust system is constituted mainly by the exhaust pipe 231, the APC valve 243 and the pressure sensor 245. The exhaust system may further include the vacuum pump 246.

A seal cap 219 serving as a furnace opening cover can airtightly seal a lower end opening of the manifold 209, is provided under the manifold 209. An O-ring 220b serving as a sealing member is provided on an upper surface of the seal cap 219 so as to be in contact with the lower end of the manifold 209. A rotating mechanism 267 to rotate a boat 217 described later is provided under the seal cap 219 opposite to the process chamber 201. A rotating shaft 255 of the rotating mechanism 267 is connected to the boat 217 through the seal cap 219. As the rotating mechanism 267 rotates the boat 217, the wafers 200 supported by the boat 217 are rotated. The seal cap 219 may be moved upward/downward in the vertical direction by a boat elevator 115 provided outside the reaction tube 203 vertically. The boat elevator 115 serves as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafers 200 into the process chamber 201 or unloads the boat 217, that is, the wafers 200 out of the process chamber 201. A shutter 219s is provided under the manifold 209. The shutter 219s serves as a furnace opening cover can airtightly seal the lower end opening of the manifold 209 while the seal cap 219 is moved downward by the boat elevator 115. An O-ring 220c serving as a sealing member is provided on an upper surface of the shutter 219s so as to be in contact with the lower end of the manifold 209. The opening/closing operations of the shutter 219s such as the elevation and the rotation are controlled by a shutter opening/closing mechanism 115s.

The boat 217 serving as the substrate retainer aligns wafers 200, for example, from 5 to 200 wafers in the vertical direction and supports the wafers 200, while the wafers 200 are horizontally oriented with their centers aligned with each other. That is, the boat 217 supports (accommodates) the wafers 200 with predetermined intervals therebetween. The boat 217 is made of a heat-resistant material such as quartz and SiC. Insulating plates 218 are provided in multiple stages under the boat 217. The insulating plates 218 are made of a heat-resistant material such as quartz and SiC.

A temperature sensor 263 serving as a temperature detector is provided in the reaction tube 203. The state of electricity conducted to the heater 207 is adjusted based on the temperature detected by the temperature sensor 263, such that the inner temperature of the process chamber 201 has a desired temperature distribution. Similar to the nozzles 410 and 420, the temperature sensor 263 is L-shaped and provided along the inner wall of the reaction tube 203.

Figure 4:
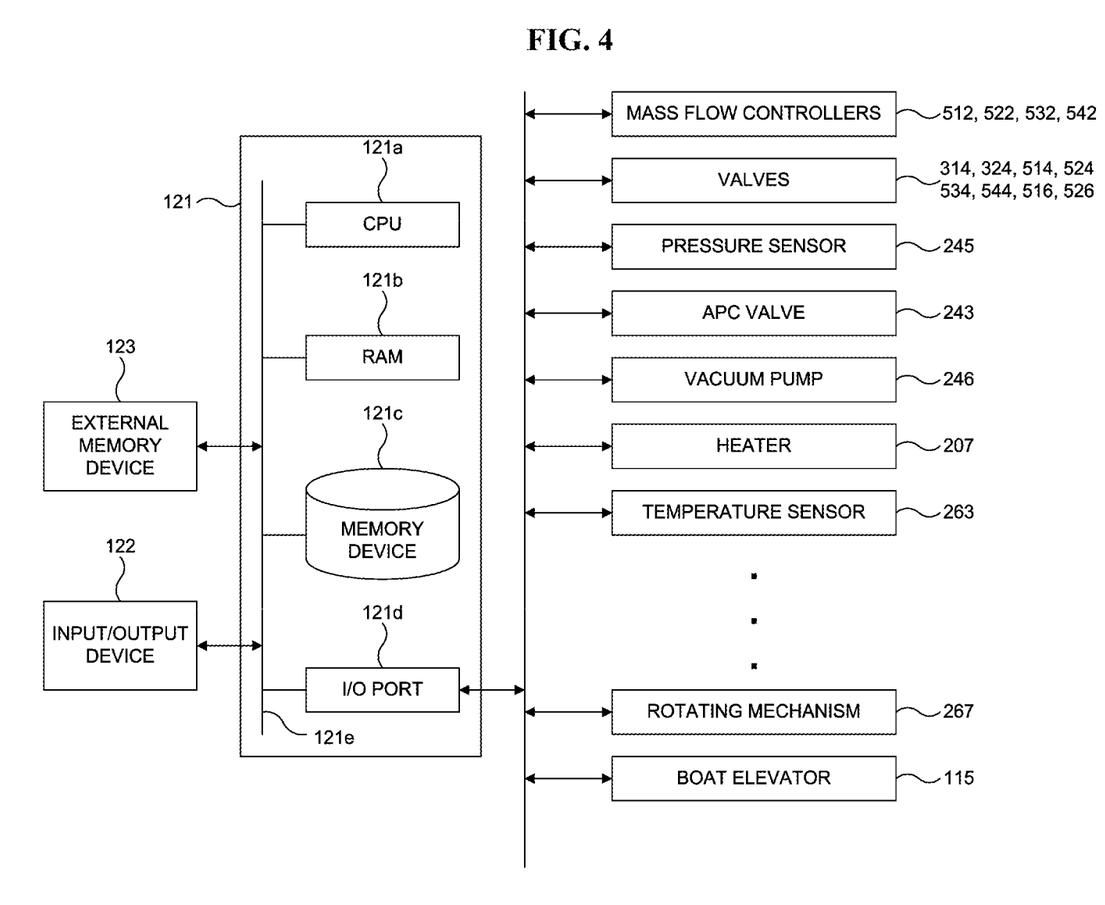
FIG. 4 is a block diagram schematically illustrating a configuration of a controller and components controlled by the controller of the substrate processing apparatus shown in FIG. 1.

A controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). A control program for controlling the operation of the substrate processing apparatus 10 or a process recipe containing information on the sequences and conditions of a substrate processing described later is readably stored in the memory device 121c. The process recipe is obtained by combining steps of a film-forming process (substrate processing) described later such that the controller 121 can execute the steps to acquire a predetermine result, and functions as a program. Hereafter, the process recipe and the control program are collectively referred to as a "program". The process recipe may be simply referred to as a "recipe". In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 512, 522, 532 and 542, the valves 314, 324, 514, 516, 524, 526, 534 and 544, the pressure sensor 245, the APC valve 243, the vacuum pump 246, the temperature sensor 263, the heater 207, the rotating mechanism 267, the boat elevator 115 and the shutter opening/closing mechanism 115s.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as flow rate adjusting operations for various gases by the MFCs 512, 522, 532 and 542, opening/closing operations of the valves 314, 324, 514, 516, 524, 526, 534 and 544, an opening/closing operation of the APC valve 243, a pressure adjusting operation by the APC valve 243 based on the pressure sensor 245, a start and stop of the vacuum pump 246, a temperature adjusting operation of the heater 207 based on the temperature sensor 263, an operation of adjusting rotation and rotation speed of the boat 217 by the rotating mechanism 267, an elevating and lowering operation of the boat 217 by the boat elevator 115, and an opening/closing operation of the shutter 219s by the shutter opening/closing mechanism 115s.

The controller 121 may be embodied by installing the above-described program stored in an external memory device 123 into a computer. For example, the external memory device 123 may include a magnetic tape, a magnetic disk such as a flexible disk and a hard disk, an optical disk such as a CD and a DVD, a magneto-optical disk such as MO, and a semiconductor memory such as a USB memory and a memory card. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Substrate Processing (Film-Forming Process)

Figure 5:
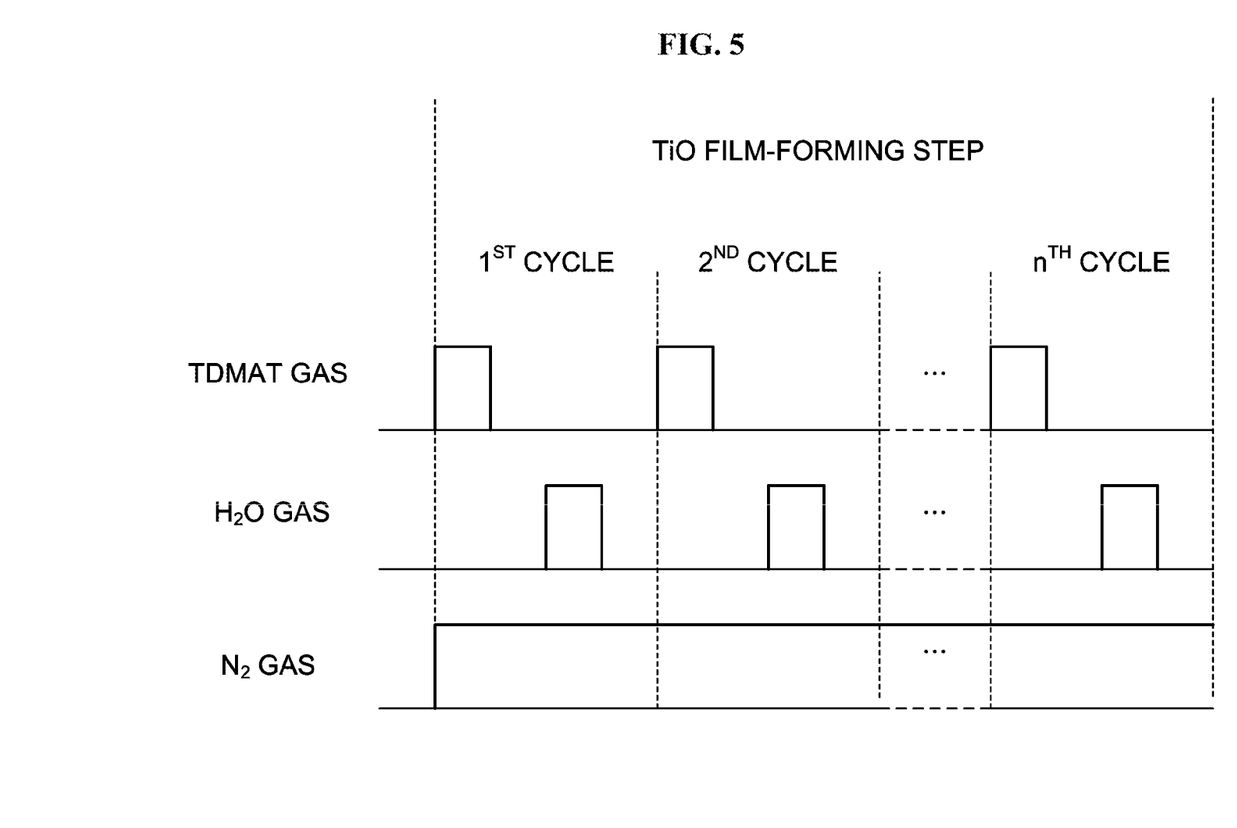
FIG. 5 exemplifies a sequence of a film-forming step according to the embodiment.

Next, an exemplary sequence of forming a $TiO_2$ film on the wafers 200, which is a part of the substrate processing for manufacturing a semiconductor device, will be described. The exemplary sequence of forming the $TiO_2$ film is performed by using the processing furnace 202 of the above-described substrate processing apparatus 10. Hereinafter, the components of the substrate processing apparatus 10 are controlled by the controller 121.

In the present specification, the term "wafer" may refer to "a wafer itself" or refer to "a wafer and a stacked structure (aggregated structure) of predetermined layers or films formed on the surface of the wafer". In addition, "surface of wafer" refers to "a surface (exposed surface) of a wafer itself" or "the surface of a predetermined layer or film formed on the wafer, i.e. the top surface of the wafer as a stacked structure". In the present specification, "substrate" and "wafer" may be used as substantially the same meaning.

Hereinafter, a method of manufacturing a semiconductor device according to the embodiment will be described in detail.

<Wafer Charging and Boat Loading Step>

After the boat 217 is charged with the wafers 200 (wafer charging), the boat 217 is elevated by the boat elevator 115 and loaded into the process chamber 201 (boat loading) as shown in FIG. 1. With the boat 217 loaded, the seal cap 219 seals the lower end opening of the reaction tube 203 via the O-ring 220b.

<Pressure and Temperature Adjusting Step>

The vacuum pump 246 vacuum-exhausts the process chamber 201 until the inner pressure of the process chamber 201 reaches a desired pressure (vacuum degree). In the pressure and temperature adjusting step, the inner pressure of the process chamber 201 is measured by the pressure sensor 245, and the APC valve 243 is feedback-controlled based on the measured pressure (pressure adjusting). The vacuum pump 246 continuously vacuum-exhausts the process chamber 201 until at least the processing of the wafers 200 is completed. The heater 207 heats the process chamber 201 until the temperature of the wafers 200 in the process chamber 201 reaches a desired temperature. The amount of the current flowing to the heater 207 is feedback-controlled based on the temperature detected by the temperature sensor 263 such that the inner temperature of the process chamber 201 has a desired temperature distribution (temperature adjusting). The heater 207 continuously heats the process chamber 201 until at least the processing of the wafers 200 is completed.

<Film-Forming Step>

Next, the film-forming step is performed by sequentially performing a source gas supply step, a first residual gas removing step, a reactive gas supply step and a second residual gas removing step.

<Source Gas Supply Step>

The valves 314 and 516 are opened to supply the TDMAT gas serving as the source gas into the gas supply pipe 310. After the flow rate of the TDMAT gas is adjusted by the MFC 312, the TDMAT gas is supplied onto the wafers 200 through the plurality of gas supply holes 410a of the nozzle 410. That is, the wafers 200 are exposed to the TDMAT gas. Then, the TDMAT gas is exhausted through the exhaust pipe 231. Simultaneously, the valve 514 is opened to supply $N_2$ gas into the gas supply pipe 510. After the flow rate of the $N_2$ gas is adjusted by the MFC 512, the $N_2$ gas is then supplied with the TDMAT gas into the process chamber 201, and exhausted through the exhaust pipe 231. In order to prevent the TDMAT gas from entering the nozzle 420, the valves 524 and 526 are opened to supply the $N_2$ gas into the gas supply pipe 520. The $N_2$ gas supplied into the gas supply pipe 520 is then supplied into the process chamber 201 through the gas supply pipe 320 and the nozzle 420, and exhausted through the exhaust pipe 231.

In the source gas supply step, the APC valve 243 is appropriately controlled to adjust the inner pressure of the process chamber 201 to a predetermined pressure. For example, the inner pressure of the process chamber 201 may range from 1 Pa to 1,200 Pa, preferably from 10 Pa to 100 Pa, more preferably from 40 Pa to 60 Pa. When the inner pressure of the process chamber 201 is higher than 1,200 Pa, a residual gas described later may not be sufficiently removed in the first residual gas removing step. When the inner pressure of the process chamber 201 is lower than 1 Pa, sufficient reaction rate of the TDMAT gas may not be obtained. In the present specification, "from 1 Pa to 1,200 Pa" refers to "1 Pa or higher and 1,200 Pa or lower." That is, the range "from 1 Pa to 1,000 Pa" includes 1 Pa as a lower limit and 1,000 Pa as an upper limit. The same also applies to other numerical ranges described herein such as flow rate, time and temperature.

The flow rate of the TDMAT gas is adjusted to a predetermined flow rate. For example, the flow rate of the TDMAT gas adjusted by the MFC 312 may range from 0.008 slm to 0.1 slm. The flow rates of the $N_2$ gas supplied through the gas pipes 510 and 520 are adjusted to predetermined flow rates, respectively. For example, the flow rates of the $N_2$ gas adjusted by the MFCs 512, 522 and 532 may range from 0.1 slm to 40 slm, respectively. The TDMAT is supplied onto the wafers 200 for a predetermined time. For example, the time duration of supplying the TDMAT gas to the wafers 200 may range from 1 second to 60 seconds.

Figure 6:
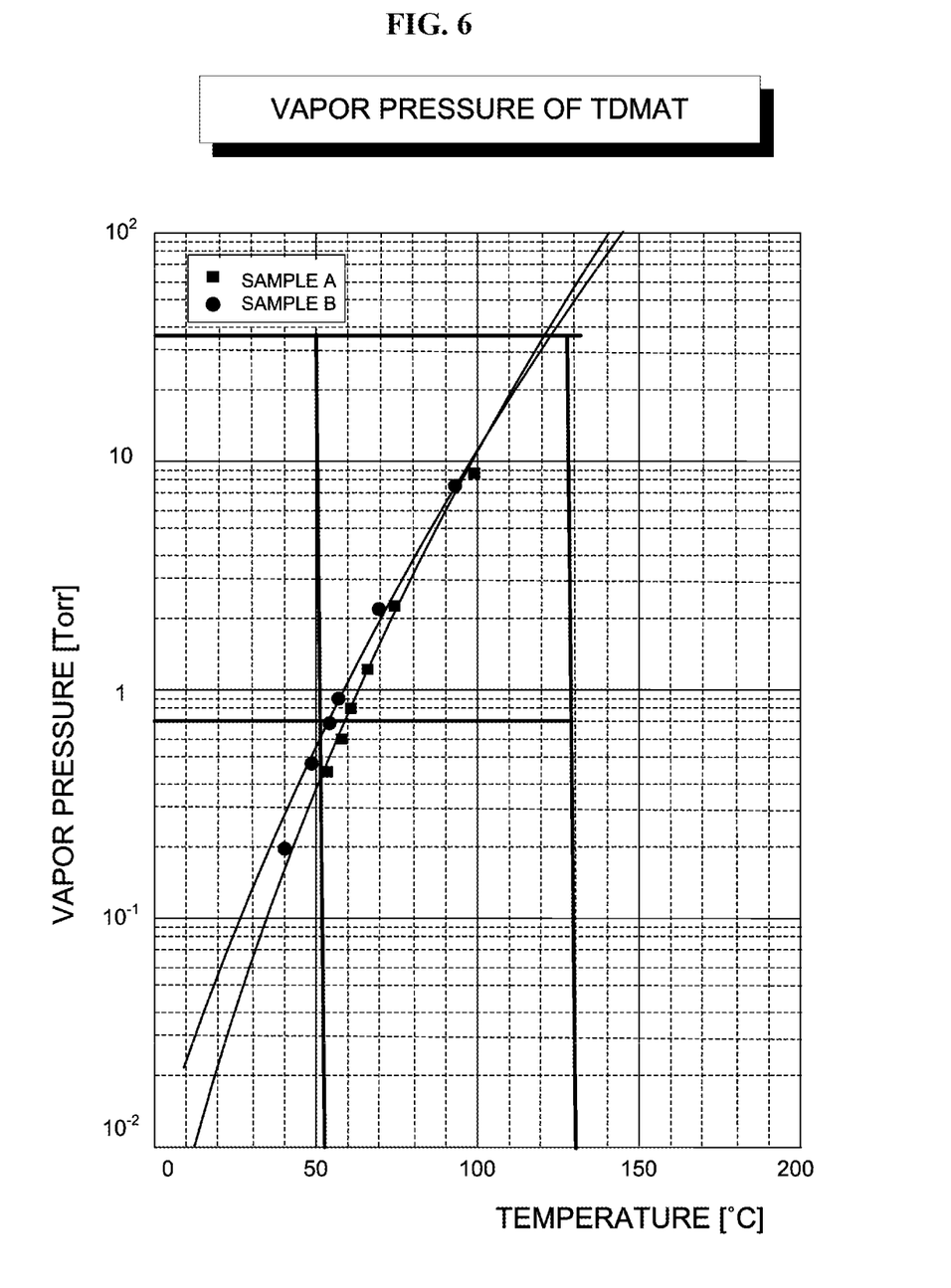
FIG. 6 schematically illustrates a vapor pressure curve of TDMAT gas and a temperature range applied in the embodiment.

In the source gas supply step, the temperature of the heater 207 is set such that the temperature of the wafers 200 is at a predetermined first temperature $T_1$ which may be within a range from 55° C. to 250° C., preferably from 55° C. to 130° C., more preferably from 90° C. to 100° C. When the first temperature $T_1$ is higher than 130 DC, the TDMAT gas may be thermally decomposed and powderized, and the powderized by-products may be easily inserted into a film (layer) described later. In addition, when the first temperature $T_1$ is higher than 250° C., the TDMAT even in a liquid state may be decomposed depending on the balance with other processing conditions. In addition, the condensation temperature of the TDMAT gas is less than 90° C. Particularly, the liquefaction of the TDMAT gas may become remarkable from around 55° C. Therefore, when the first temperature $T_1$ is lower than 55° C., the TDMAT gas may be re-liquefied. FIG. 6 schematically illustrates a vapor pressure curve of TDMAT gas. Referring to FIG. 6, the TDMAT gas is supplied under the conditions indicated in the bold line shown in FIG. 6. Since the heater 207 heats the reaction tube 203, the temperature of the wafers 200 (that is, the first temperature $T_1$) may also be referred to as the temperature of the reaction tube 203 or the inner temperature of the process chamber 201.

In the source gas supply step, only the TDMAT gas and the $N_2$ gas are supplied into the process chamber 201. By supplying the TDMAT gas into the process chamber 201 under the above-described conditions, a titanium-containing layer is formed on the wafers 200. When the TDMAT gas is supplied as the source gas in the source gas supply step, organic compounds such as carbon (C), hydrogen (H) and oxygen (O) and isopropanol which is a monohydric alcohol may be contained in the titanium-containing layer. Therefore, the titanium-containing layer may also be referred to as a TDMAT layer which is an adsorption layer of the TDMAT.

The temperature of the exhaust pipe 231 provided between the process chamber 201 and the APC valve 243 is set to a predetermined second temperature $T_3$. For example, the second temperature $T_3$ may be within a range from the first temperature $T_1$ to 130° C., preferably from a temperature higher than the first temperature $T_1$ to 110° C., more preferably from a temperature higher than the first temperature $T_1$ to 100° C. For example, the second temperature $T_3$ is within a range from 1.0 to 1.6 times as high as the first temperature $T_1$, preferably from 1.0 to 1.4 times, and more preferably from 1.0 to 1.2 times as high as the first temperature $T_1$ in centrigrade.

<First Residual Gas Removing Step>

After the source gas supply step is completed, the valve 314 is closed to stop the supply of the TDMAT gas. In the first residual gas removing step, with the APC valve 243 open, the vacuum pump 246 vacuum-exhausts the inside of the process chamber 201 to remove a residual TDMAT gas which did not react or which contributed to the formation of the titanium-containing layer from the process chamber 201. By maintaining the valves 514, 513, 524 and 526 open, the $N_2$ gas is continuously supplied into the process chamber 201. The $N_2$ gas serves as a purge gas, which improves the efficiency of removing the residual TDMAT gas which did not react or which contributed to the formation of the titanium-containing layer from the process chamber 201. In the first residual gas removing step, the vacuum exhaust of the process chamber 201 and the purging of the process chamber 201 by supplying the $N_2$ gas may be performed simultaneously or be performed alternately (cyclically) a predetermined number of times until the reactive gas supply step described later is started. In case of performing the vacuum exhaust and the purging simultaneously, the inner pressure of the process chamber 201 is set to a pressure higher than that of the process chamber 201 in the source gas supply step by supplying the $N_2$ gas. In case of performing the vacuum exhaust and the purging alternately, the inner pressure of the process chamber 201 at the time when the process chamber 201 is vacuum-exhausted is set to a pressure ranging from 1 Pa to 100 Pa, preferably from 1 Pa to 30 Pa, such that the inner pressure of the process chamber 201 is lower than that of the process chamber 201 in the source gas supply step. In addition, in case of performing the vacuum exhaust and the purging alternately, the inner pressure of the process chamber 201 at the time when the process chamber 201 is purged by the $N_2$ gas is set to a pressure ranging from 1 Pa to 1,500 Pa, preferably from 80 Pa to 110 Pa, such that the inner pressure of the process chamber 201 is higher than that of the process chamber 201 in the source gas supply step. By alternately performing the vacuum exhaust and the purging by the $N_2$ gas, it is possible to improve the efficiency of removing the residual gas.

<Reactive Gas Supply Step>

The valves 324 and 526 are opened to supply the $H_2O$ gas serving as the oxygen-containing gas into the gas supply pipe 320. After the flow rate of the $H_2O$ gas is adjusted by the MFC 322, the $H_2O$ gas is supplied onto the wafers 200 through the plurality of gas supply holes 420b of the nozzle 420. That is, the wafers 200 are exposed to the $H_2O$ gas. Then, the $H_2O$ gas is exhausted through the exhaust pipe 231. Simultaneously, the valve 524 is opened to supply $N_2$ gas into the gas supply pipe 520. After the flow rate of the $N_2$ gas is adjusted by the MFC 512, the $N_2$ gas is then supplied with the $H_2O$ gas into the process chamber 201, and exhausted through the exhaust pipe 231. In order to prevent the $H_2O$ gas from entering the nozzle 410, the valves 514 and 516 are opened to supply $N_2$ gas into the gas supply pipe 510. The $N_2$ gas supplied into the gas supply pipe 510 is then supplied into the process chamber 201 through the gas supply pipe 310 and the nozzle 410, and exhausted through the exhaust pipe 231.

In the reactive gas supply step, the APC valve 243 is appropriately controlled to adjust the inner pressure of the process chamber 201 to a predetermined pressure. For example, the inner pressure of the process chamber 201 may range from 1 Pa to 1,200 Pa, preferably from 10 Pa to 100

Pa, more preferably from 30 Pa to 50 Pa. When the inner pressure of the process chamber 201 is higher than 1,200 Pa, a residual gas described later may not be sufficiently removed in the second residual gas removing step. When the inner pressure of the process chamber 201 is lower than 1 Pa, the sufficient film-forming rate may not be obtained.

The flow rate of the $H_2O$ gas is adjusted to a predetermined flow rate. For example, the flow rate of the $H_2O$ gas adjusted by the MFC 322 may range from 1 slm to 80 slm, preferably from 5 slm to 40 slm, more preferably from 10 slm to 30 slm. As the flow rate of the $H_2O$ gas increases, the impurities generated from the source gas can be suppressed from being inserted into the TiO film. However, if the flow rate of the $H_2O$ gas is higher than 40 slm, the residual gas may not be sufficiently removed in the second residual gas removing step described later.

The flow rates of the $N_2$ gas supplied through the gas pipes 510 and 520 are adjusted to predetermined flow rates, respectively. For example, the flow rates of the $N_2$ gas adjusted by the MFCs 512, 522 and 542 may range from 0.2 slm to 30 slm, respectively. The $H_2O$ is supplied onto the wafers 200 for a predetermined time. For example, the time duration of supplying the $H_2O$ gas onto the wafers 200 may range from 1 second to 60 seconds. In the reactive gas supply step, the temperature of the heater 207 and the temperature of the exhaust pipe 231 provided between the process chamber 201 and the APC valve 243 are set in the same manners as in the first step.

In the reactive gas supply step, only the $H_2O$ gas and the $N_2$ gas are supplied into the process chamber 201. The $H_2O$ gas reacts with the titanium-containing layer formed on the wafers 200 in the source gas supply step to form a $TiO_2$ layer (hereafter, also referred to as "TiO layer") containing titanium (Ti) and oxygen (O) on the wafers 200.

<Second Residual Gas Removing Step>

After the $TiO_2$ layer is formed, the valve 324 is closed to stop the supply of the $H_2O$ gas. A residual $H_2O$ gas which did not react or which contributed to the formation of the TiO layer and reaction by-products remaining in the process chamber 201 are exhausted from the process chamber 201 in the same manner as in the first residual gas removing step. Similar to the first residual gas removing step, the vacuum exhaust of the process chamber 201 and the purging of the process chamber 201 by supplying the $N_2$ gas may be performed simultaneously or alternately (cyclically) a predetermined number of times in the second residual gas removing step.

<Performing Predetermined Number of Times>

By performing a cycle wherein the source gas supply step, the first residual gas removing step, the reactive gas supply step and the second residual gas removing step are performed non-simultaneously in order a predetermined number of times (one or more times), that is, by performing the cycle $n_1$ times ($n_1$ is an integer equal to or greater than 1), a titanium oxide film (TiO film) having a predetermined thickness (for example, 0.05 nm to 100 nm) is formed on the wafers 200.

<Purging and Returning to Atmospheric Pressure Step>

After the film-forming step is completed, the valves 514, 516, 524 and 526 are opened to supply the $N_2$ gas into the process chamber 201 through each of the gas supply pipes 510 and 520, and then the $N_2$ supplied into the process chamber 201 is exhausted through the exhaust pipe 231. The $N_2$ gas acts as the purge gas. The gas or the reaction by-products remaining in the process chamber 201 are removed from the process chamber 201 by supplying the $N_2$ gas (purging). Thereafter, the inner atmosphere of the process chamber 201 is replaced with the inert gas (substitution by inert gas), and the inner pressure of the process chamber 201 is returned to atmospheric pressure (returning to atmospheric pressure).

<Boat Unloading and Wafer Discharging Step>

Thereafter, the seal cap 219 is lowered by the boat elevator 115 and the lower end of the manifold 209 is opened. The boat 217 with the processed wafers 200 charged therein is unloaded from the reaction tube 203 through the lower end of the reaction tube 203 (boat unloading). The processed wafers 200 are then unloaded (discharged) from the boat 217 (wafer discharging).

According to the embodiment, the temperature $T_3$ of the exhaust pipe 231 may be set to be constant from the connection portion whereat the exhaust pipe 231 is connected to the process chamber 201 to the APC valve 243, or may changes gradually in accordance with the distance from the process chamber 201. When the temperature changes at a portion close to the process chamber 201, the process gases such as the source gas and the reactive gas may flow backward and a cold spot may occur in that portion. However, when the temperature of the exhaust pipe 231 is set to be constant, it is possible to suppress the occurrence of the cold spot even when the process gases flow backward. When the temperature $T_3$ of the exhaust pipe 231 changes gradually in accordance with the distance from the process chamber 201, the temperature of the connection portion (whereat the exhaust pipe 231 is connected to the process chamber 201) is set to the same temperature as the process chamber 201, and the temperature of the exhaust pipe 231 other than the connection portion is set to become higher toward the downstream side of the exhaust pipe 231. As describe above, it is possible to set the temperature of the exhaust pipe 231 according to a temperature variation rate such that the temperature of the exhaust pipe 231 varies in proportion to the distance from the connection portion of the exhaust pipe 231 whereat the exhaust pipe 231 is connected to the process chamber 201 (i.e., the distance between the measured point at the exhaust pipe 231 and the connection portion of the exhaust pipe 231).

In addition, when the temperature $T_3$ of the exhaust pipe 231 is set to a temperature higher than the temperature $T_1$ of the heater 207 (that is, the temperature of the process chamber 201) in the film-forming step, the temperature $T_3$ of the exhaust pipe 231 may be the same or different between the respective steps: the source gas supply step, the first residual gas removing step, the reactive gas supply step and the second residual gas removing step. For example, the temperature $T_3$ in the source gas supply step and the reactive gas supply step may be set to the same temperature as the temperature $T_1$ of the process chamber 201, and the temperature $T_3$ in the first residual gas removing step and the second residual gas removing step may be set to a temperature higher than the temperature $T_1$ of the process chamber 201. In the source gas supply step and the reactive gas supply step, the inner pressure of the process chamber 201 is higher than that of the process chamber 201 in the first residual gas removing step and the second residual gas removing step. Since the vaporized gas is easily liquefied when the pressure is high, it is possible to suppress the risk of the liquefaction by lowering the pressure of the exhaust pipe 231 in the first residual gas removing step and the second residual gas removing step. As described above, the temperature of the exhaust pipe 231 may be appropriately maintained at the same temperature according to the thermal decomposition temperature of the source gas and the pressure (liquefaction risk) in the process chamber 201, or may be changed for each step.

In addition, at least in the film-forming step, the temperatures of the gas supply pipes 310, 320, 510 and 520 and the tanks 610 and 620 are adjusted as follows.

The gas supply pipes 310, 320, 510 and 520 are heated by heaters (not shown) serving as heating apparatuses (heating mechanisms, heating systems), respectively. The temperature of the gas supply pipe 310 provided between the process chamber 201 and the valve 516 and the temperature of the gas supply pipe 320 provided between the process chamber 201 and the valve 526 are set to the same temperature $T_1$ which is the temperature of the heater 207 (the temperature of process chamber 201). When the temperature changes at a portion close to the process chamber 201, the process gases such as the source gas and the reactive gas may flow backward and a cold spot may occur in that portion. However, when the temperatures of the gas supply pipes 310 and 320 are set to the same temperature $T_1$ as the temperature of the process chamber 201, it is possible to suppress the occurrence of the cold spot even when the process gases flow backward.

The temperatures of the gas supply pipes 310 and 510 provided between the valves 516 and 514 and the tank 610 and the temperatures of the gas supply pipes 320 and 520 provided between the valves 526 and 524 and the tank 620 are set to a predetermined temperature $T_2$. The temperature $T_2$ may range from 55 DC to the temperature $T_1$, preferably from 70° C. to the temperature $T_1$, more preferably from 80° C. to a temperature less than the temperature $T_1$. The temperature $T_2$, may be equal to the temperature $T_1$ in consideration of the vaporization efficiency or may be lower than the temperature $T_1$ in order to reduce the temperature difference from a temperature $T_4$ described later.

The temperatures of the tanks 610 and 620 are set to the predetermined temperature $T_4$. The temperature $T_4$ may range from 25° C. to 40° C. As described above, the temperatures of the gas supply pipes 310, 320, 510 and 520 may be set to become lower in proportion to the distances from the process chamber 201, respectively. By the temperatures of the gas supply pipes 310, 320, 510 and 520 becoming gradually closer to the temperature of the process chamber 201, it is possible to supply each gas stably.

In addition, when the temperature $T_3$ of the exhaust pipe 231 is set to a temperature higher than the temperature $T_1$ of the process chamber 203 in the film-forming step, the temperature $T_3$ may be lowered to the temperature $T_1$ when the inner pressure of the process chamber 201 is being returned to the atmospheric pressure. If the temperature of the process chamber 201 and the temperature of the exhaust pipe 231 are different from each other, the convection (backflow) of the gas may occur when the exhaust pipe 231 reaches the atmospheric pressure. Therefore, in order to suppress the convection, when the inner pressure of the process chamber 201 is being returned to the atmospheric pressure, the temperature of the exhaust pipe 231 may be changed to the same temperature as the temperature of the process chamber 201.

In addition, the TDMAT gas may be supplied and removed alternately in a divided manner in the source gas supply step of the above-described cycle. According to the divided manner, the TDMAT gas is supplied and removed alternately a plurality of times in the source gas supply step without changing the total amount of the TDMAT gas supplied in the source gas supply step of the cycle. Therefore, it is possible to reduce the amount of the impurities inserted into the titanium-containing layer. In addition, the $H_2O$ gas may be supplied and removed alternately in a divided manner in the reactive gas supply step of the above-described cycle. According to the divided manner, the $H_2O$ gas is supplied and removed alternately a plurality of times in the reactive gas supply step without changing the total amount of the $H_2O$ gas supplied in the reactive gas supply step of the cycle. Therefore, it is possible to accelerate the reaction with the titanium-containing layer and the $H_2O$ gas.

(3) Effects According to the Embodiment

According to the embodiment, one or more advantageous effects described below can be achieved.

(a) When the temperature of the process chamber is set to the temperature lower than the thermal decomposition temperature of the vaporized gas and higher than the condensation temperature of the vaporized gas, the temperature of the exhaust pipe is set to the temperature equal to or slightly higher than the temperature of the process chamber. Therefore, it is possible to suppress the thermal decomposition of the vaporized gas. Even if the vaporized gas is thermally decomposed in the exhaust pipe, the by-products are not powderized but adhere to the exhaust pipe as a film. Thus, it is possible to suppress the re-liquefaction of the vaporized gas in the exhaust pipe.

(b) When the temperature of the process chamber is set to the temperature lower than the thermal decomposition temperature of the vaporized gas and higher than the condensation temperature of the vaporized gas, the temperature of the exhaust pipe is set to the temperature equal to or higher than the temperature of the process chamber and equal to or lower than 1.6 times the temperature of the process chamber in centigrade. Therefore, it is possible to suppress the thermal decomposition of the vaporized gas. Even if the vaporized gas is thermally decomposed in the exhaust pipe, the by-products are not powderized but adhere to the exhaust pipe as a film. Thus, it is possible to suppress the re-liquefaction of the vaporized gas in the exhaust pipe.

(c) By alternately performing the vacuum exhaust and the purging by the $N_2$ gas in the first and second residual gas removing steps, it is possible to improve the efficiency of removing the residual gas.

(d) By setting the temperature of the exhaust pipe to the same temperature as the process chamber, it is possible to suppress the occurrence of the cold spot even when the process gases flow backward.

(e) When the temperature of the exhaust pipe gradually changes in accordance with the distance from the process chamber, by setting the connection portion whereat the exhaust pipe is connected to the process chamber to the same temperature as the process chamber and setting the temperature of the exhaust pipe 231 other than the connection portion to become higher toward the downstream side of the exhaust pipe, it is possible to suppress the occurrence of the cold spot even when the process gases flow backward.

(f) By setting the temperature to be different between the exhaust pipe in the source gas supply step, the first residual gas removing step, the reactive gas supply step and the second residual gas removing step, it is possible to suppress the risk of the liquefaction due to the inner pressure of the process chamber.

(g) By setting the temperatures of the connection portions of the gas supply pipes to the same temperature as the process chamber, it is possible to suppress the occurrence of the cold spot even when the process gases flow backward, wherein the connection portions of the gas supply pipes are the portions whereat the gas supply pipes are connected to the process chamber, respectively.

(h) By setting the temperatures of the connection portions of the gas supply pipes to become lower in proportion to the distances from the process chamber, it is possible to supply the process gases stably.

(i) By setting the temperature of the exhaust pipe to the same temperature as the process chamber when the inner pressure of the process chamber is being returned to the atmospheric pressure, it is possible to suppress the convection of the process gases.

(j) By alternately supplying and removing the source gas a plurality of times in the source gas supply step in each cycle, it is possible to reduce the amount of the impurities inserted into the layer formed in the source gas supply step.

(k) By alternately supplying and removing the reactive gas a plurality of times in the reactive gas supply step in each cycle, it is possible to accelerate the reaction with the layer formed in the source gas supply step and the reactive gas in the reactive gas supply step.

Other Embodiments

The above-described embodiment and the examples may be appropriately combined. While the technique is described by way of the above-described embodiment and the examples, the above-described technique is not limited thereto. The above-described technique may be modified in various ways without departing from the gist thereof.

While the above-described embodiment is described by way of an example in which the TiO film is formed using titanium (Ti) as the metal element, the above-described technique is not limited thereto. For example, the above-described technique may be applied to the formations of other films using an organic material based source. For example, the above-described technique may be applied to the formations of films such as a zirconium oxide film ($ZrO_2$), a hafnium oxide film ($HfO_2$), an aluminum oxide film ($Al_2O_3$), a tungsten oxide film ($WO_3$) and a tantalum oxide film ($Ta_2O_5$).

For example, an organic material based source gas such as chlorotri (N-ethylmethyl amino) titanium ($Ti[N(CH_3)CH_2CH_3]_3Cl$, abbreviated as TIA), tetrakis diethyl amino titanium ($Ti[N(CH_2CH_3)_2]_4$, abbreviated as TDEAT), tetrakis dimethyl amino titanium ($Ti[N(CH_3)_2]_4$, abbreviated as TDMAT), tetrakis ethylmethyl amino zirconium ($Zr[N(CH_3)CH_2CH_3]_4$, abbreviated as TEMAZ), tetrakis ethylmethyl amino hafnium ($Hf[N(CH_3)CH_2CH_3]_4$, abbreviated as TEMAH), trimethyl aluminum ($(CH_3)_3Al$, abbreviated as TMA), bis (tertiary butyl imino) bis (tertiary butyl amino) tungsten ($(C_4H_9NH)_2W(C_4H_9N)_2$), tungsten hexacarbonyl ($W(CO)_6$), penta ethoxy tantalum ($Ta(OC_2H_5)_5$, abbreviated as PET) and tris ethylmethyl amino tertiary butyl amino tantalum ($Ta[NC(CH_3)_3][N(C_2H_5)CH_3]_3$, abbreviated as TBTEMT) may be used as the source gas.

While the above-described embodiment is described by way of an example in which the $H_2O$ gas is used as the reactive gas, the above-described technique is not limited thereto. Instead of the $H_2O$ gas, for example, various gases such as ozone ($O_3$), plasma-excited oxygen ($O_2$), hydrogen peroxide ($H_2O_2$), nitrous oxide ($N_2O$) and a mixed gas of plasma-excited oxygen ($O_2$) and plasma-excited hydrogen ($H_2$) may be used as the reactive gas.

While the above-described embodiment is described by way of an example in which the $N_2$ gas is used as the inert gas. However, the above-described technique is not limited thereto. Instead of the $N_2$ gas, for example, rare gases such as argon (Ar) gas, helium (He) gas, neon (Ne) gas and xenon (Xe) gas may be used as the inert gas.

In addition, a base film (underlying film) on which the film such as the TiO film is formed can be appropriately selected. For example, a film such as an aluminum (Al) film may be used as the base film.

The above-described embodiment is described by way of an example in which the substrate processing apparatus (a batch type vertical apparatus capable of simultaneously processing a plurality of substrates) is used to form the film, According to the above-described embodiment, the processing furnace of the batch type vertical apparatus (that is, a batch type substrate apparatus) has a single-tube structure which includes the reaction tube. According to the single-tube structure, the nozzles configured to supply the process gases are provided vertically in the single reaction tube of the processing furnace and the exhaust port is provided at the lower portion of the single reaction tube. However, the above-described technique is not limited thereto. The above-described technique may be applied to form the film by using a processing furnace having another structure. For example, the above-described technique may also be applied when the film is formed by using a processing furnace having a double-tube structure which includes two reaction tubes (a reaction tube at the outside is referred to as an outer tube and a reaction tube at the inside is referred to as an inner tube) having a concentric-shaped cross-section. According to the double-tube structure, the process gases are supplied through nozzles provided vertically in the inner tube and exhausted through an exhaust port provides at a side wall of the outer tube at a position (symmetrical position) opposite the nozzles with the substrates therebetween. Instead of supplying the process gases through the nozzles described above, the process gases may be supplied through gas supply ports provided at the side wall of the inner tube. When the process gases are supplied through the gas supply ports, exhaust ports may be provided according to face of the plurality substrates which are stacked and accommodated in the process chamber. In addition, the shape of the exhaust ports may be a hole-shape or a slit-shape.

The recipe used for the substrate processing such as the film-forming process and a cleaning process (that is a program defining the process sequences and the processing conditions of the substrate processing) is preferably prepared individually according to the processing contents such as type of film to be formed or removed, composition ratio of the film, the quality the film, the thickness of the film, the process sequences and the processing conditions, and is stored in the memory device 121c via an electric communication line or the external memory device 123. When starting the substrate processing, the CPU 121a preferably selects an appropriate recipe among the plurality of recipe stored in the memory device 121c according to the contents of the substrate processing. Thus, various films having different types, composition ratios, different qualities and different thicknesses may be formed at high reproducibility using a single substrate processing apparatus. Further, since the burden on the operator such as inputting the processing sequences and the processing conditions may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the input/output device 122 of the substrate processing apparatus.

While the above-described embodiment is described by way of an example in which the batch type substrate processing apparatus capable of simultaneously processing a plurality of substrates is used to form the film, the above-described technique is not limited thereto. For example, the above-described technique may be applied to the film formation using a single type substrate processing apparatus capable of simultaneously processing a single substrate or a small number of substrates. While a substrate processing apparatus having a hot wall type processing furnace is exemplified in the above-described embodiment, the above-described technique is not limited thereto. For example, the above-described technique may be applied the film formation using a substrate processing apparatus having a cold wall type processing furnace. The film formation may be performed according to the processing sequences and the processing conditions same as those of the above-described embodiments and examples using these substrate processing apparatuses.

As described above, the above-described technique may be applied to a method of manufacturing a semiconductor device, a substrate processing apparatus for processing a substrate such as a semiconductor wafer and a glass substrate, and a non-transitory computer-readable recording medium.

According to the technique described herein, it is possible to suppress the thermal decomposition and the re-liquefaction of the vaporized gas in the exhaust pipe when the liquid source is vaporized and used as the vaporized gas to form the film on the substrate.

What is claimed is:

1. A method of manufacturing a semiconductor device, comprising:
   forming a film on a substrate by performing a cycle a predetermined number of times, wherein the cycle comprises sequentially performing:
   (a) supplying a source gas to the substrate accommodated in a reaction tube;
   (b) exhausting the source gas remaining in the reaction tube through an exhaust pipe connected to the reaction tube;
   (c) supplying a reactive gas to the substrate exposed previously to the source gas;
   (d) exhausting the reactive gas remaining in the reaction tube through the exhaust pipe; and
   (e) adjusting an inner pressure of the exhaust pipe to atmospheric pressure in a state where a temperature of the exhaust pipe is lowered from a second temperature to a first temperature equal to or higher than 55° C. and equal to or lower than 130° C. after the film is formed on the substrate,
   wherein at least in (a) and (c), a temperature of the reaction tube is set to the first temperature lower than a thermal decomposition temperature of the source gas and higher than a condensation temperature of the source gas, the temperature of the exhaust pipe is set to the second temperature equal to or higher than the first temperature, and the reaction tube is depressurized in (a) through (d).

2. The method of claim 1, wherein the second temperature is set to be equal to or lower than 130° C.

3. The method of claim 1, wherein the second temperature is set to be higher than the first temperature.

4. The method of claim 3, wherein the temperature of the exhaust pipe is set to the second temperature in (b) and (d).

5. The method of claim 3, wherein the temperature of the exhaust pipe in (a) through (d) is adjusted according to the inner pressure of the exhaust pipe in (a) through (d), respectively.

6. The method of claim 1, wherein the temperature of the exhaust pipe is maintained at the second temperature in (a) through (d).

7. The method of claim 1, wherein the source gas is supplied into the reaction tube through a source gas supply pipe and the reactive gas is supplied into the reaction tube through a reactive gas supply pipe, and a temperature of a connection portion of the source gas supply pipe whereat the source gas supply pipe is connected to the reaction tube and a temperature of a connection portion of the reactive gas supply pipe whereat the reactive gas supply pipe is connected to the reaction tube are set to the first temperature.

8. The method of claim 7, wherein the temperature of the source gas supply pipe is set to become lower in proportion to a distance between the reaction tube and the connection portion of the source gas supply pipe and the temperature of the reactive gas supply pipe is set to become lower in proportion to a distance between the reaction tube and the connection portion of the reactive gas supply pipe.

9. The method of claim 1, wherein the temperature of the exhaust pipe is set to be equal to the first temperature in (a) and (c), and the temperature of the exhaust pipe is set to be higher than the first temperature in (b) and (d) so as to reduce the inner pressure of the exhaust pipe.

10. The method of claim 1, wherein the second temperature of the exhaust pipe has a temperature variation rate such that the second temperature of the exhaust pipe varies in proportion to a distance from a connection portion of the exhaust pipe whereat the exhaust pipe is connected to the reaction tube.

11. A non-transitory computer-readable recording medium storing a program that causes, by a computer, a substrate processing apparatus to perform:
    forming a film on a substrate by performing a cycle a predetermined number of times, wherein the cycle comprises sequentially performing:
    (a) supplying a source gas to the substrate accommodated in a reaction tube;
    (b) exhausting the source gas remaining in the reaction tube through an exhaust pipe connected to the reaction tube;
    (c) supplying a reactive gas to the substrate exposed previously to the source gas;
    (d) exhausting the reactive gas remaining in the reaction tube through the exhaust pipe; and
    (e) adjusting an inner pressure of the exhaust pipe to atmospheric pressure in a state where a temperature of the exhaust pipe is lowered from a second temperature to a first temperature equal to or higher than 55° C. and equal to or lower than 250° C. after the film is formed on the substrate,
    wherein at least in (a) and (c), a temperature of the reaction tube is set to the first temperature lower than a thermal decomposition temperature of the source gas and higher than a condensation temperature of the source gas, the temperature of the exhaust pipe is set to the second temperature equal to or higher than the first temperature, and the reaction tube is depressurized in (a) through (d).

12. The non-transitory computer-readable recording medium of claim 11, wherein the first temperature is set to be within a range from 55° C. to the second temperature, and the second temperature is set to be equal to or lower than 130° C.

* * * * *